(12) United States Patent
Shin

(10) Patent No.: US 9,224,972 B2
(45) Date of Patent: Dec. 29, 2015

(54) ORGANIC LIGHT EMITTING DIODE DISPLAY HAVING DUAL GATE THIN FILM TRANSISTORS

(71) Applicant: Samsung Display Co., Ltd., Yongin, Gyeonggi-Do (KR)

(72) Inventor: Hwang-Sup Shin, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 10 days.

(21) Appl. No.: 13/915,528

(22) Filed: Jun. 11, 2013

(65) Prior Publication Data

US 2014/0070184 A1 Mar. 13, 2014

(30) Foreign Application Priority Data

Sep. 13, 2013 (KR) ........................ 10-2012-0101667

(51) Int. Cl.
| | | |
|---|---|---|
| H01L 29/08 | (2006.01) | |
| H01L 29/04 | (2006.01) | |
| H01L 27/15 | (2006.01) | |
| H01L 21/00 | (2006.01) | |
| H01L 51/52 | (2006.01) | |
| H05B 33/08 | (2006.01) | |
| H01L 27/32 | (2006.01) | |

(52) U.S. Cl.
CPC ............ *H01L 51/52* (2013.01); *H05B 33/0803* (2013.01); *H01L 27/3276* (2013.01); *Y02B 20/36* (2013.01)

(58) Field of Classification Search
CPC ..... H01L 51/52; H01L 27/3276; H01L 51/50; H01L 29/7869; H01L 27/1225; H01L 27/3262; H01L 27/6246; H01L 27/326; H05B 33/0896

USPC .......... 257/40, 43, 59, 89, 98, 79, 99, E21.46; 438/104, 29

See application file for complete search history.

(56) References Cited

U.S. PATENT DOCUMENTS

| | | | | |
|---|---|---|---|---|
| 2001/0019133 | A1* | 9/2001 | Konuma et al. .................. | 257/79 |
| 2004/0145547 | A1* | 7/2004 | Oh .................................. | 345/76 |
| 2005/0017934 | A1* | 1/2005 | Chung et al. .................... | 345/82 |
| 2006/0125381 | A1* | 6/2006 | Oh ................................ | 313/504 |

(Continued)

FOREIGN PATENT DOCUMENTS

| | | |
|---|---|---|
| KR | 10-0458714 B1 | 11/2004 |
| KR | 10-0485531 B1 | 4/2005 |
| KR | 10-2011-0056621 A | 5/2011 |

*Primary Examiner* — Dzung Tran
(74) *Attorney, Agent, or Firm* — Knobbe, Martens, Olson & Bear, LLP

(57) ABSTRACT

An organic light emitting diode (OLED) display is disclosed. In one embodiment, the display includes: 1) a data line and a driving voltage line crossing a scan line and respectively transmitting a data signal and a driving voltage, 2) a switching thin film transistor connected to the scan line and the data line and 3) a driving thin film transistor connected to the switching thin film transistor and the driving voltage line. The display also includes a compensation thin film transistor compensating a threshold voltage of the driving thin film transistor and connected to the driving thin film transistor and an OLED connected to the driving thin film transistor, wherein the compensation gate electrode of the compensation thin film transistor includes a first compensation gate electrode and a second compensation gate electrode separated from and formed with different layers from each other.

26 Claims, 9 Drawing Sheets

(56) References Cited

U.S. PATENT DOCUMENTS

2007/0040770 A1* 2/2007 Kim .................................. 345/76
2009/0273547 A1* 11/2009 Tanikame et al. ................ 345/76
2010/0181563 A1* 7/2010 Kim et al. ........................ 257/40
2011/0273419 A1* 11/2011 Park et al. ...................... 345/211
2012/0033156 A1* 2/2012 Yamazaki et al. ............... 349/62

* cited by examiner

ORGANIC LIGHT EMITTING DIODE DISPLAY HAVING DUAL GATE THIN FILM TRANSISTORS

RELATED APPLICATIONS

This application claims priority to and the benefit of Korean Patent Application No. 10-2012-0101667 filed in the Korean Intellectual Property Office on Sep. 13, 2012, the entire contents of which are incorporated herein by reference.

BACKGROUND

1. Field

The described technology generally relates to an organic light emitting diode (OLED) display.

2. Description of the Related Technology

An OLED display generally includes two electrodes and an organic emission layer disposed between the two electrodes, electrons injected from one electrode and holes injected from the other electrode are combined in the organic emission layer such that excitons are formed, and light is emitted by energy generated from the excitons.

The OLED display also includes a plurality of pixels including an OLED as a self-light emitting element, and each pixel includes a plurality of thin film transistors and a capacitor to drive the OLED.

SUMMARY

One inventive aspect is an organic light emitting diode (OLED) display forming a dual gate structure and preventing spot generation in high resolution.

Another aspect is an organic light emitting diode (OLED) display which includes: a substrate; a scan line formed on the substrate and transmitting a scan signal; a data line and a driving voltage line crossing the scan line and respectively transmitting a data signal and a driving voltage; a switching thin film transistor connected to the scan line and the data line; a driving thin film transistor connected to the switching thin film transistor and the driving voltage line; a compensation thin film transistor compensating a threshold voltage of the driving thin film transistor and connected to the driving thin film transistor; and an organic light emitting diode (OLED) connected to the driving thin film transistor, wherein the compensation gate electrode of the compensation thin film transistor includes a first compensation gate electrode and a second compensation gate electrode separated from and formed with different layers from each other.

The compensation thin film transistor may include: a compensation semiconductor layer formed on the substrate; a first gate insulating layer covering the compensation semiconductor layer; a first compensation gate electrode formed on the first gate insulating layer; a second gate insulating layer covering the first gate insulating layer and the first compensation gate electrode; and a second compensation gate electrode formed on the second gate insulating layer.

The first compensation gate electrode may be close to the compensation source electrode of the compensation thin film transistor, and the second compensation gate electrode may be close to the compensation drain electrode of the compensation thin film transistor.

The first compensation gate electrode may be connected to the second compensation gate electrode through a gate contact hole formed in the second gate insulating layer.

The first compensation gate electrode and the second compensation gate electrode may be parallel to each other.

The first compensation gate electrode and the second compensation gate electrode may be formed with an angle therebetween.

The first compensation gate electrode may be formed with the same layer as the scan line.

An initialization thin film transistor that is turned on according to a prior scan signal transmitted through a prior scan line and transmitting an initialization voltage to the driving gate electrode of the driving thin film transistor may be further included, and the initialization gate electrode of the initialization thin film transistor may include a first initialization gate electrode and a second initialization gate electrode that are separated from and formed with different layers from each other.

The initialization thin film transistor may include: an initialization semiconductor layer formed on the substrate; an first initialization gate electrode formed on the first gate insulating layer covering the initialization semiconductor layer; and a second initialization gate electrode formed on the second gate insulating layer covering the first gate insulating layer and the first initialization gate electrode.

The first initialization gate electrode may be close to the initialization source electrode of the initialization thin film transistor, and the second initialization gate electrode may be close to the initialization drain electrode of the initialization thin film transistor.

The first initialization gate electrode may be connected to the second initialization gate electrode through a gate contact hole formed in the second gate insulating layer.

The first initialization gate electrode and the second initialization gate electrode may be parallel to each other.

The first initialization gate electrode and the second initialization gate electrode may be formed with an angle therebetween.

The first initialization gate electrode may be formed with the same layer as the scan line.

The switching gate electrode of the switching thin film transistor may include a first switching gate electrode and a second switching gate electrode separated and formed with different layers from each other.

The switching thin film transistor may include: a switching semiconductor layer formed on the substrate; a first switching gate electrode formed on the first gate insulating layer covering the switching semiconductor layer; and a second switching gate electrode formed on the second gate insulating layer covering the first gate insulating layer and the first switching gate electrode.

The first switching gate electrode may be close to the switching source electrode of the switching thin film transistor, and the second switching gate electrode may be close to the switching drain electrode of the switching thin film transistor.

The first switching gate electrode may be connected to the second switching gate electrode through a gate contact hole formed in the second gate insulating layer.

A light emission control thin film transistor that is turned on by a light emission control signal transmitted through the light emission control line and transmitting the driving voltage from the driving thin film transistor to the organic light emitting diode (OLED) may be further included, and the light emission control gate electrode of the light emission control thin film transistor may include a first light emission control gate electrode and a second light emission control gate electrode that are separated and formed with different layers from each other.

The light emission control thin film transistor may include: a light emission control semiconductor layer formed on the substrate; a first light emission control gate electrode formed on the first gate insulating layer covering the light emission control semiconductor layer; and a second light emission control gate electrode formed on the second gate insulating layer covering the first gate insulating layer and the first light emission control gate electrode.

The first light emission control gate electrode may be close to the light emission control source electrode of the light emission control thin film transistor, and the second light emission control gate electrode may be close to the light emission control drain electrode of the light emission control thin film transistor.

The first light emission control gate electrode may be connected to the second light emission control gate electrode through a gate contact hole formed in the second gate insulating layer.

An operation control thin film transistor that is turned on by a light emission control signal transmitted through the light emission control line and transmitting the driving voltage to the driving thin film transistor may be further include, and the operation control gate electrode of the operation control thin film transistor may include a first operation control gate electrode and a second operation control gate electrode that are separated and formed with different layers from each other.

The operation control thin film transistor may include: an operation control semiconductor layer formed on the substrate; a first operation control gate electrode formed on the first gate insulating layer covering the operation control semiconductor layer; and a second operation control gate electrode formed on the second gate insulating layer covering the first gate insulating layer and the first operation control gate electrode.

The first operation control gate electrode may be close to the operation control source electrode of the operation control thin film transistor, and the second operation control gate electrode may be close to the operation control drain electrode of the operation control thin film transistor.

The first operation control gate electrode may be connected to the second operation control gate electrode through a gate contact hole formed in the second gate insulating layer.

DETAILED DESCRIPTION

Figure 1:
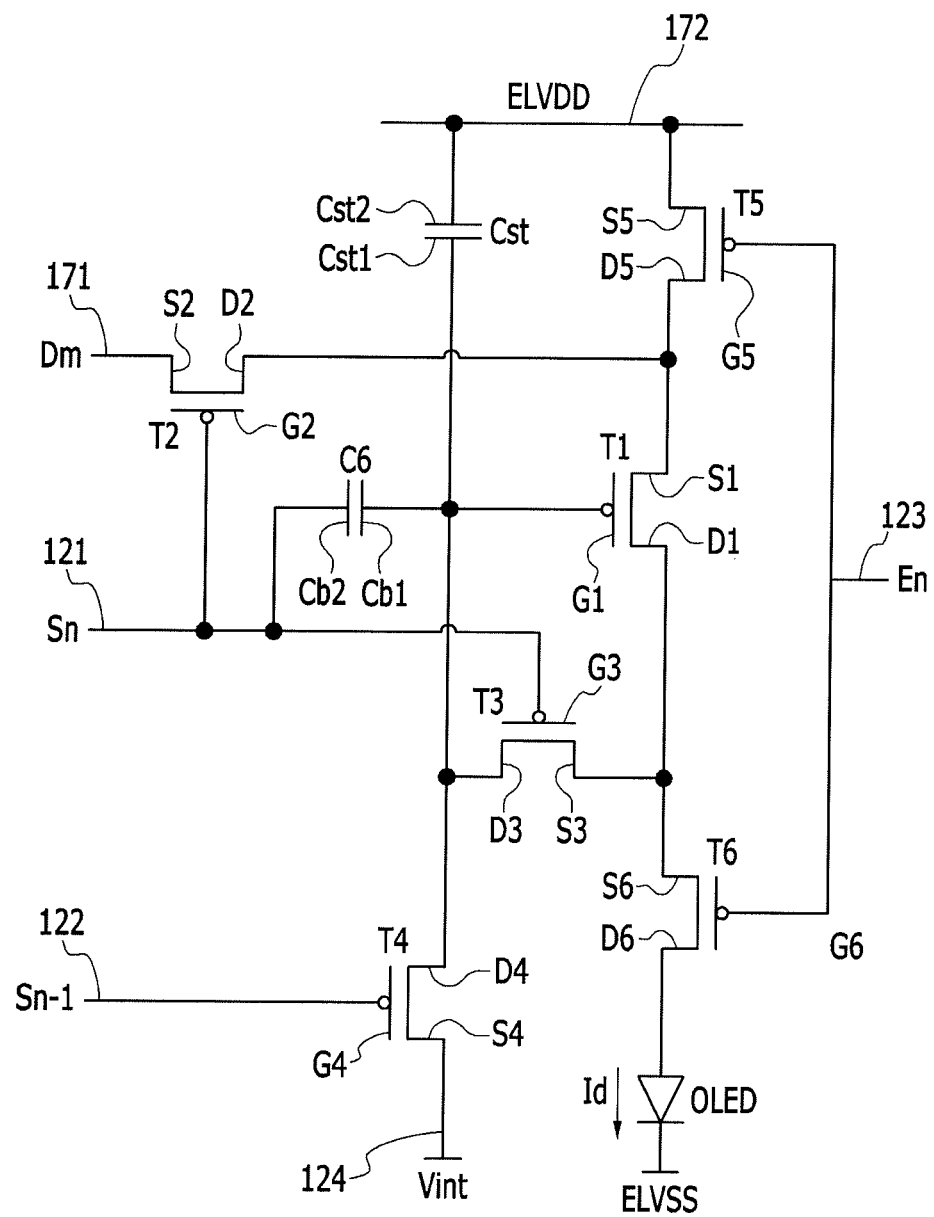
FIG. 1 is an equivalent circuit of one pixel of an organic light emitting diode (OLED) display according to a first embodiment.

Generally, to reduce an off-leakage current that is leakage in an off state of an OLED thin film transistor (TFT), a dual gate structure forming two gate electrodes at a channel region of the thin film transistor is used. However, it is generally difficult to form the dual gate structure due to a limited space in high resolution OLED displays.

Embodiments will be described more fully hereinafter with reference to the accompanying drawings. As those skilled in the art would realize, the described embodiments may be modified in various different ways, all without departing from the spirit or scope of the present invention. Like reference numerals designate like elements and similar constituent elements throughout the specification.

Further, since sizes and thicknesses of constituent members shown in the accompanying drawings are arbitrarily given for better understanding and ease of description, the present invention is not limited to the illustrated sizes and thicknesses.

In the drawings, the thickness of layers, films, panels, regions, etc., are exaggerated for clarity. In the drawings, for better understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, but does not essentially mean positioning on the upper side of the object portion based on a gravity direction.

Moreover, an active matrix (AM) type of organic light emitting diode display having a 6Tr-2Cap structure including one pixel, six thin film transistors (TFT), and two capacitors is shown in the accompanying drawings, but the present invention is not limited thereto. Accordingly, the organic light emitting diode display may include one pixel, a plurality of thin film transistors, and at least one capacitor, and a separate wire may be further formed or a known wire may be omitted to provide various structures. Here, the pixel means a minimum unit displaying an image, and the organic light emitting diode display displays the image through a plurality of pixels.

Now, an organic light emitting diode display according to an embodiment will be described in detail with reference to FIGS. 1 to 5.

FIG. 1 is an equivalent circuit of one pixel of an organic light emitting diode (OLED) display according to an embodiment.

As shown in FIG. 1, one pixel of the OLED display includes a plurality of signal lines 121, 122, 123, 124, 171, and 172, and a plurality of thin film transistors T1, T2, T3, T4, T5, and T6, capacitors Cst and Cb, and an OLED connected to the signal lines.

The thin film transistor includes a driving thin film transistor T1, a switching thin film transistor T2, a compensation thin film transistor T3, an initialization thin film transistor T4, an operation control thin film transistor T5, and a light emission control thin film transistor T6, and the capacitors Cst and Cb include a storage capacitor Cst and a boosting capacitor Cb.

The signal lines include a scan line 121 transferring a scan signal Sn, a prior scan line 122 transferring a prior scan signal Sn−1 to the initialization thin film transistor T4, a light emission control line 123 transferring a light emission control signal En to the operation control thin film transistor T5 and the light emission control thin film transistor T6, a data line 171 crossing the scan line 121 and transferring a data signal Dm, a driving voltage line 172 transferring a driving voltage ELVDD and formed substantially parallel to the data line 171, and an initialization voltage line 124 transferring an initialization voltage Vint initializing the driving thin film transistor T1.

A gate electrode G1 of the driving thin film transistor T1 is connected to an end Cst1 of the storage capacitor Cst, a source electrode S1 of the driving thin film transistor T1 is connected to the driving voltage line 172 via the operation control thin film transistor T5, and a drain electrode D1 of the driving thin film transistor T1 is electrically connected to an anode of the OLED via the second light emission control thin film transistor T6. The driving thin film transistor T1 receives the data signal Dm according to a switching operation of the switching thin film transistor T2 to supply a driving current to the OLED.

A gate electrode G2 of the switching thin film transistor T2 is connected to the scan line 121, a source electrode S2 of the switching thin film transistor T2 is connected to the data line 171, and a drain electrode D2 of the switching thin film transistor T2 is connected to the driving voltage line 172 via the operation control thin film transistor T5 while being connected to the source electrode S1 of the driving thin film transistor T1. The switching thin film transistor T2 is turned on according to the scan signal Sn transferred through the scan line 121 to perform a switching operation transferring the data signal Dm transferred to the data line 171 to the source electrode of the driving thin film transistor T1.

A gate electrode G3 of the compensation thin film transistor T3 is connected to the scan line 121, the gate electrode G2 of the switching thin film transistor T2, and the other end Cb2 of the boosting capacitor Cb, a source electrode S3 of the compensation thin film transistor T3 is connected to the anode of the OLED via the light emission control thin film transistor T6 while being connected to the drain electrode D1 of the driving thin film transistor T1, and a drain electrode D3 of the compensation thin film transistor T3 is connected to one end Cst1 of the storage capacitor Cst, one end Cb1 of the boosting capacitor Cb, the gate electrode G1 of the driving thin film transistor T1, and the drain electrode D4 of the initialization thin film transistor T4. The compensation thin film transistor T3 is turned on according to the scan signal Sn transferred through the scan line 121 to connect the gate electrode G1 and the drain electrode D1 of the driving thin film transistor T1 to each other, thus performing diode-connection of the driving thin film transistor.

A gate electrode G4 of the initialization thin film transistor T4 is connected to the prior scan line 122, a source electrode S4 of the initialization thin film transistor T4 is connected to the initialization voltage line 124, and a drain electrode D4 of the initialization thin film transistor T4 is connected to an end Cb1 of the boosting capacitor, an end Cst1 of the storage capacitor, the drain electrode D3 of the compensation thin film transistor T3, and the gate electrode G1 of the driving thin film transistor T1. The initialization thin film transistor T4 is turned on according to the prior scan signal Sn−1 transferred through the prior scan line 122 to transfer the initialization voltage Vint to the gate electrode G1 of the driving thin film transistor T1, thus performing an initialization operation initializing the voltage of the gate electrode G1 of the driving thin film transistor T1.

A gate electrode G5 of the operation control thin film transistor T5 is connected to the light emission control line 123, a source electrode S5 of the operation control thin film transistor T5 is connected to the driving voltage line 172, and a drain electrode D5 of the operation control thin film transistor T5 is connected to the source electrode S1 of the driving thin film transistor T1 and the drain electrode S2 of the switching thin film transistor T2.

A gate electrode G6 of the light emission control thin film transistor T6 is connected to the light emission control line 123, a source electrode S6 of the light emission control thin film transistor T6 is connected to the drain electrode D1 of the driving thin film transistor T1 and the source electrode S3 of the compensation thin film transistor T3, and a drain electrode D6 of the light emission control thin film transistor T6 is electrically connected to the anode of the OLED. The operation control thin film transistor T5 and the light emission control thin film transistor T6 are turned on according to the light emission control signal En transferred through the light emission control line 123 to transfer the driving voltage ELVDD to the OLED, thus allowing the driving current to flow in the OLED.

The other end Cst2 of the storage capacitor Cst is connected to the driving voltage line 172, and a cathode of the OLED is connected to a common voltage ELVSS. Accordingly, the OLED receives a driving current Id from the driving thin film transistor T1 to emit light, thereby displaying an image.

Hereinafter, an operation of one pixel of the organic light emitting diode display according to embodiments will be described in detail.

First, a prior scan signal Sn−1 of a low level is supplied through the prior scan line 122 during an initialization period. Then, the initialization thin film transistor T4 is turned on corresponding to the prior scan signal Sn−1 of the low level, and the initialization voltage Vint is connected from the initialization voltage line 124 through the initialization thin film transistor T4 to the gate electrode of the driving thin film transistor T1 to initialize the driving thin film transistor T1 by the initialization voltage Vint.

Subsequently, the scan signal Sn of the low level is supplied through the scan line 121 during a data programming period. Then, the switching thin film transistor T2 and the compensation thin film transistor T3 are turned on corresponding to the scan signal Sn of the low level.

In this case, the driving thin film transistor T1 is diode-connected by the turned-on compensation thin film transistor T3, and biased in a forward direction.

Then, a compensation voltage Dm+Vth (Vth is a negative value) obtained by subtracting the threshold voltage Vth of the driving thin film transistor T1 from the data signal Dm supplied from the data line 171 is applied to the gate electrode of the driving thin film transistor T1.

The driving voltage ELVDD and the compensation voltage Dm+Vth are applied to both ends of the storage capacitor Cst, and a charge corresponding to a difference between voltages at both ends thereof is stored in the storage capacitor Cst.

Next, if the voltage level of the scan signal Sn is changed into the high level while the supply of the scan signal Sn is stopped, the voltage applied to the gate electrode G1 of the driving thin film transistor T1 is changed corresponding to the change width of the voltage of the scan signal Sn by the coupling of the boosting capacitor Cb. At this time, the voltage applied to the gate electrode G1 of the driving thin film transistor T1 is changed by charge sharing between the storage capacitor Cst and the boosting capacitor Cb such that the change amount of the voltage applied to the driving gate electrode G1 is proportional to the charge sharing value between the storage capacitor Cst and the boosting capacitor Cb as well as the change width of the voltage of the scan signal Sn.

Subsequently, the level of the light emission control signal En supplied from the light emission control line 123 during the light emission period is changed from the high level to the low level. Then, the operation control thin film transistor T5 and the light emission control thin film transistor T6 are turned on by the light emission control signal En of the low level during the light emission period.

Then, the driving current Id is generated according to a difference between the voltage of the gate electrode of the driving thin film transistor T1 and the driving voltage ELVDD, and the driving current Id is supplied through the light emission control thin film transistor T6 to the OLED. The gate-source voltage Vgs of the driving thin film transistor T1 is maintained at '(Dm+Vth)-ELVDD' by the storage capacitor Cst during the light emission period, and the driving current Id is proportional to a square of a value obtained by subtracting the threshold voltage Vth from the source-gate voltage, that is, '(Dm-ELVDD)2', according to a current-voltage relationship of the driving thin film transistor T1. Accordingly, the driving current Id is determined regardless of the threshold voltage Vth of the driving thin film transistor T1.

Now, a detailed structure of the pixel of the organic light emitting diode display shown in FIG. 1 will be described in detail with reference to FIGS. 2 to 5 together with FIG. 1.

Figure 2:
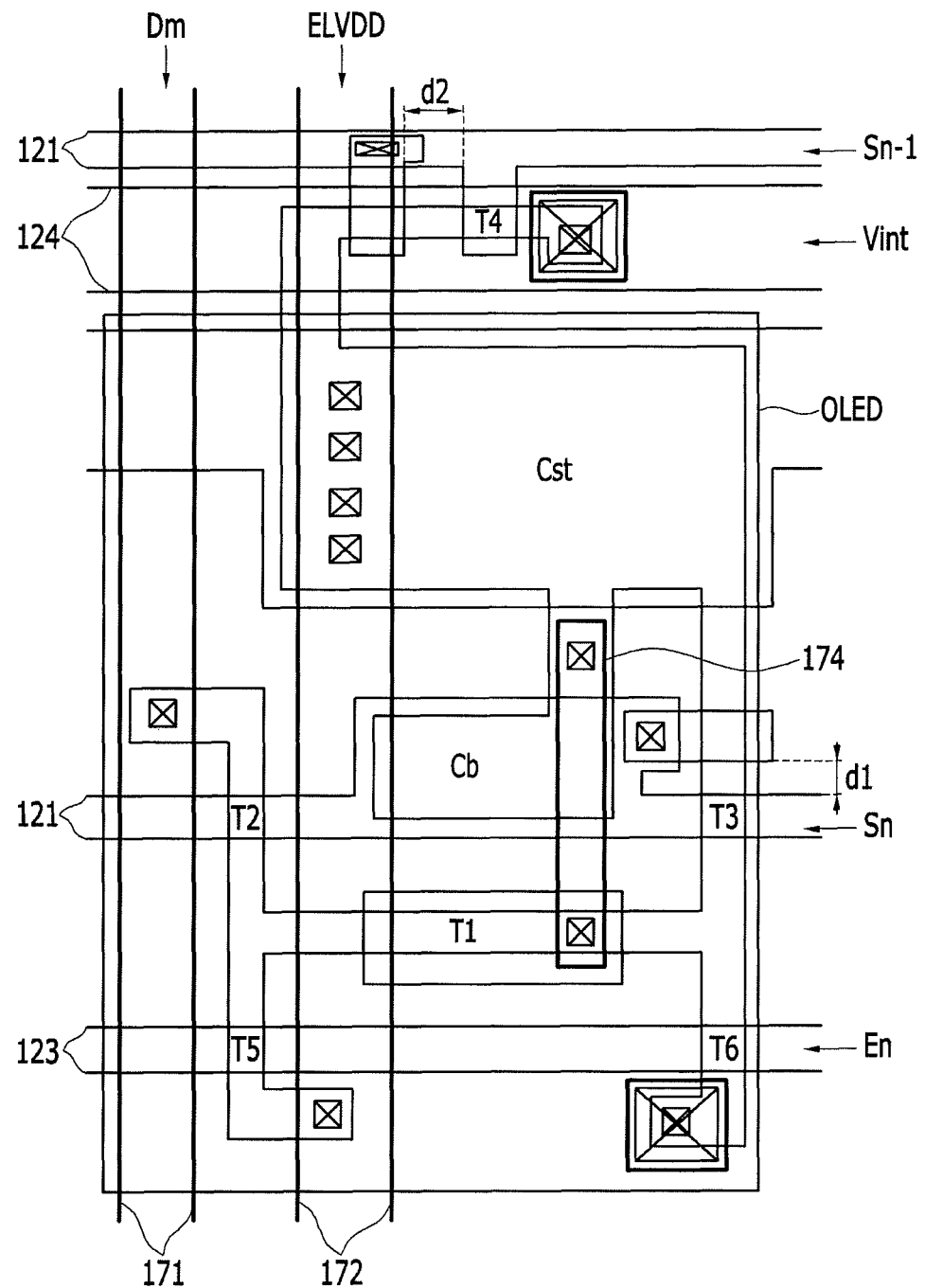
FIG. 2 is a schematic view showing a position of a plurality of thin film transistors and capacitors in one pixel of an OLED display according to the first embodiment.
Figure 3:
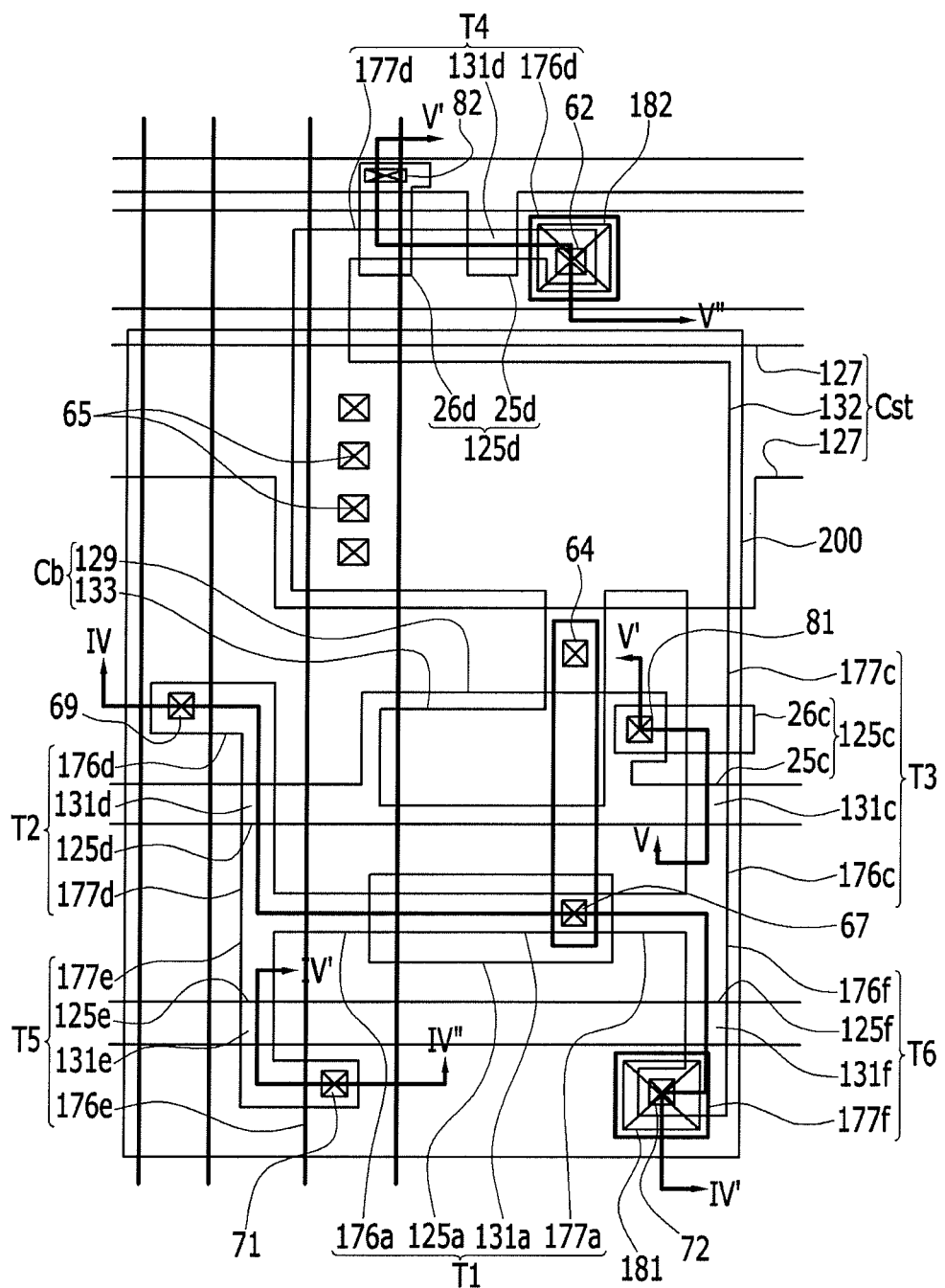
FIG. 3 is a layout view of one pixel of an OLED display according to the first embodiment.
Figure 4:
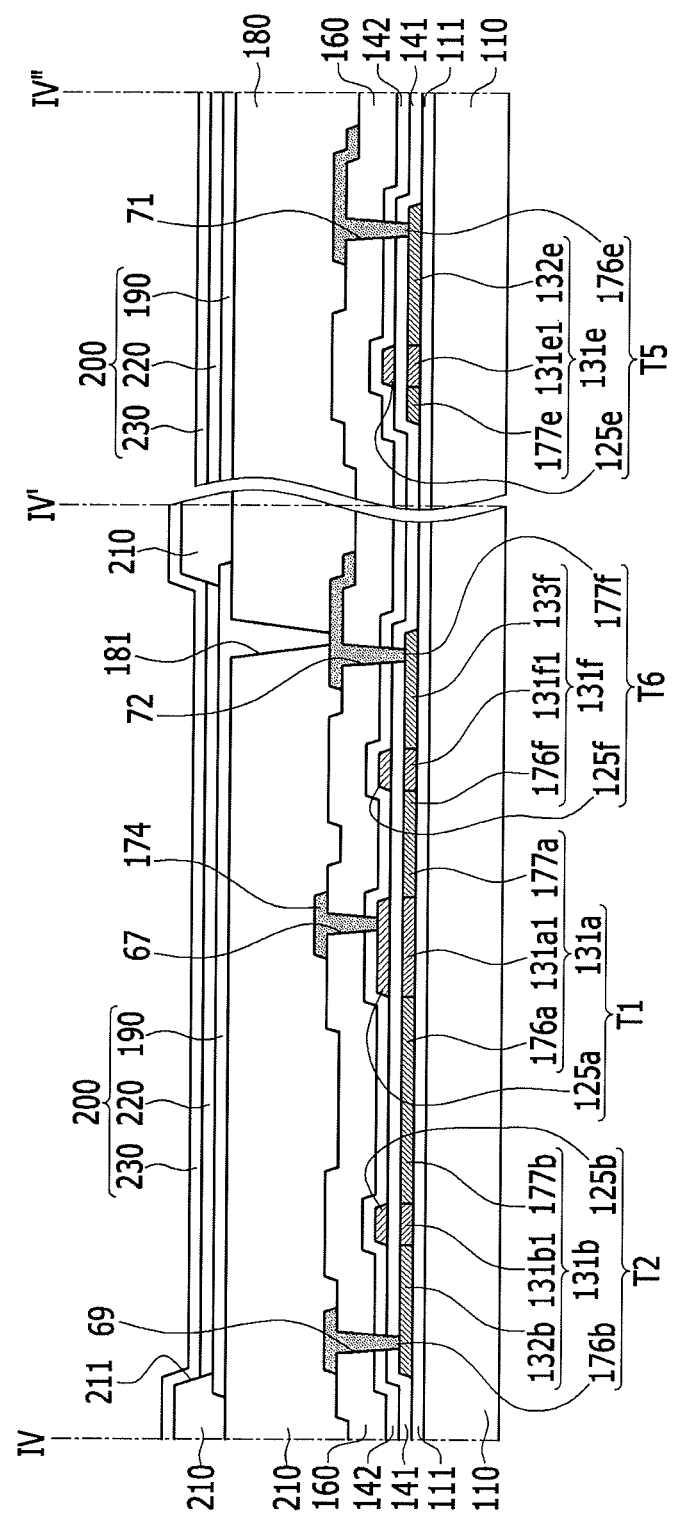
FIG. 4 is a cross-sectional view of the OLED display shown in FIG. 3 taken along the line IV-IV".
Figure 5:
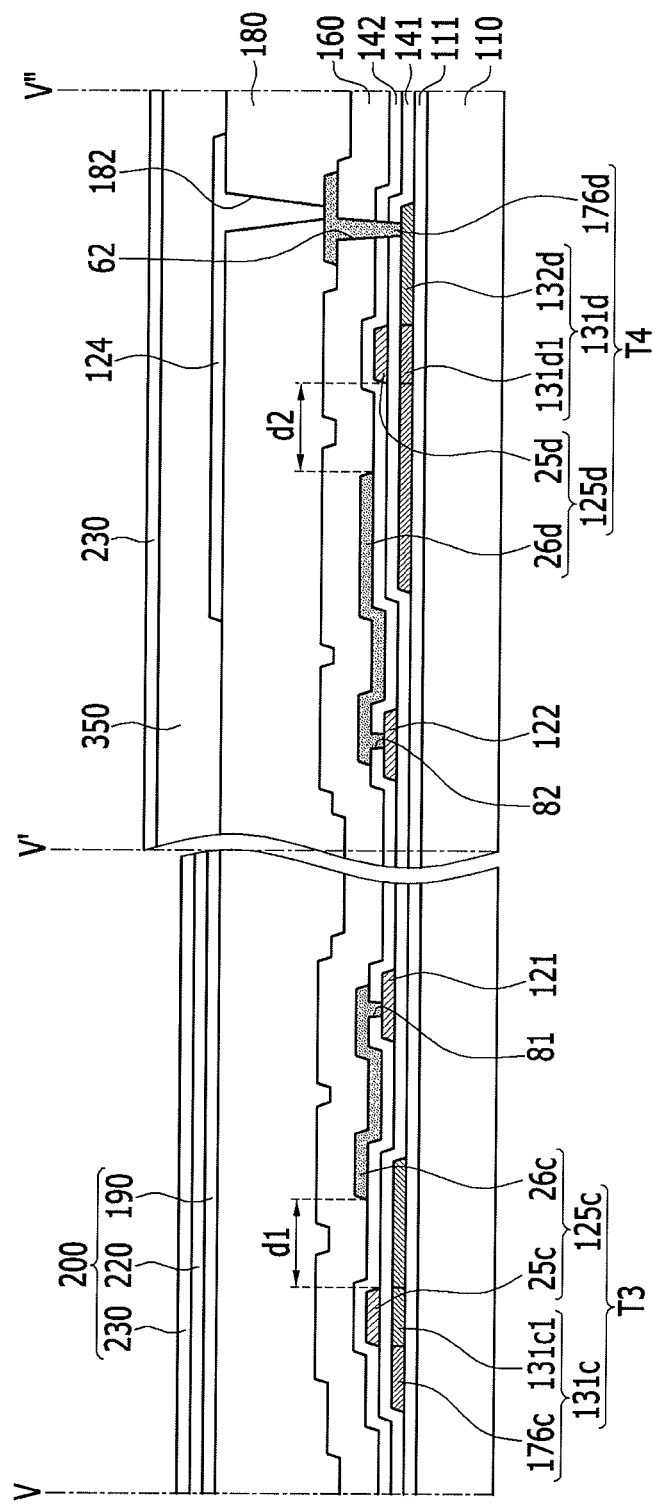
FIG. 5 is a cross-sectional view of the OLED display shown in FIG. 3 taken along the line V-V".

FIG. 2 is a schematic view showing a position of a plurality of thin film transistors and capacitors in one pixel of an OLED display according to the first embodiment, FIG. 3 is a layout view of one pixel of an OLED display according to the first embodiment, FIG. 4 is a cross-sectional view of the OLED display shown in FIG. 3 taken along the line IV-IV", and FIG. 5 is a cross-sectional view of the OLED display shown in FIG. 3 taken along the line V-V".

As shown in FIGS. 2 to 5, the pixel of the organic light emitting diode display according to the first embodiment includes the scan line 121, the prior scan line 122, the light emission control line 123, and the initialization voltage line 124 applying the scan signal Sn, the prior scan signal Sn−1, the light emission control signal En, and the initialization voltage Vint, respectively, and is formed in a row direction, and the data line 171 and the driving voltage line 172 crossing all of the scan line 121, the prior scan line 122, the light emission control line 123, and the initialization voltage line 124 and applying the data signal Dm and the driving voltage ELVDD, respectively, to the pixel.

Further, in the pixel, the driving thin film transistor T1, the switching thin film transistor T2, the compensation thin film transistor T3, the initialization thin film transistor T4, the operation control thin film transistor T5, the light emission control thin film transistor T6, the storage capacitor Cst, and the OLED 200 are formed.

The driving thin film transistor T1, the switching thin film transistor T2, the compensation thin film transistor T3, the initialization thin film transistor T4, the operation control thin film transistor T5, and the light emission control thin film transistor T6 are formed along a semiconductor layer 131, and the semiconductor layer 131 is bent to have various shapes. The semiconductor layer 131 is formed of polysilicon, and includes a channel region not doped with an impurity and a source region and a drain region formed at both sides of the channel region to be doped with the impurity. Herein, the impurity is changed according to a kind of thin film transistor, and an N-type impurity or a P-type impurity may be used. The semiconductor layer 131 includes a driving semiconductor layer 131a formed in the driving thin film transistor T1, a switching semiconductor layer 131b formed in the switching thin film transistor T2, a compensation semiconductor layer 131c formed in the compensation thin film transistor T3, an initialization semiconductor layer 131d formed in the initialization thin film transistor T4, an operation control semiconductor layer 131e formed in the operation control thin film transistor T5, and a light emission control semiconductor layer 131f formed in the light emission control thin film transistor T6.

The driving thin film transistor T1 includes the driving semiconductor layer 131a, a driving gate electrode 125a, a driving source electrode 176a, and a driving drain electrode 177a. The driving source electrode 176a corresponds to the driving source region 176a doped with the impurity in the driving semiconductor layer 131a, and the driving drain electrode 177a corresponds to the driving drain region 177a doped with the impurity in the driving semiconductor layer 131a. The driving gate electrode 125a overlaps the driving semiconductor layer 131a and has a rectangular shape.

The driving gate electrode 125a is formed with the same material and at the same layer as the scan line 121, the prior scan line 122, the light emission control line 123, a switching gate electrode 125b, a second storage capacitor plate 127, and a second boosting capacitor plate 129.

The switching thin film transistor T2 includes the switching semiconductor layer 131b, the switching gate electrode 125b, a switching source electrode 176b, and a switching drain electrode 177b. The switching source electrode 176b is a portion of the data line 171, and the switching drain electrode 177b corresponds to the switching drain region 177b doped with the impurity in the switching semiconductor layer 131b.

The compensation thin film transistor T3 includes the compensation semiconductor layer 131c, a compensation gate electrode 125c, a compensation source electrode 176c, and a compensation drain electrode 177c, wherein the compensation source electrode 176c corresponds to the compensation source region 176c doped with the impurity in the compensation semiconductor layer 131c, and the compensation drain electrode 177c corresponds to the compensation drain region 177c doped with the impurity in the compensation semiconductor layer 131c.

The compensation gate electrode 125c includes a first compensation gate electrode 25c that is a portion of the scan line 121 and a second compensation gate electrode 26c that is separated from and is substantially parallel to the first compensation gate electrode 25c and formed with a different layer therefrom. The second compensation gate electrode 26c may have a straight line shape as shown in FIG. 2, or may have a straight line shape having a protruding portion. As described above, the compensation gate electrode 125c is formed with a dual gate electrode structure including the first compensation gate electrode 25c and the second compensation gate electrode 26c that are separated from each other thereby reducing the off-leakage current.

The initialization thin film transistor T4 includes the initialization semiconductor layer 131d, an initialization gate electrode 125d, an initialization source electrode 176d, and an initialization drain electrode 177d. The initialization source electrode 176d of the quadrangular shape is formed with the same material as the data line 171. Also, the initialization source electrode 176d connects the initialization semiconductor layer 131d and the initialization voltage line 124 through a contact hole 62 continuously formed in a first gate insulating layer 141, a second gate insulating layer 142, and an interlayer insulating layer 160, and the initialization drain electrode 177d corresponds to the initialization drain region 177d doped with the impurity in the initialization semiconductor layer 131d.

The initialization gate electrode 125d is protruded from the prior scan line 122 and includes a first initialization gate electrode 25d and a second initialization gate electrode 26d that are separated from and in substantially parallel to each other and formed with the different layer. The second initialization gate electrode 26d may have the straight shape having the protruding portion as shown in FIG. 2, or may have the straight shape without the protruding portion. As described above, the initialization gate electrode 125d is formed of the dual gate electrode structure including the first initialization gate electrode 25d and the second initialization gate electrode 26d that are separated from each other thereby reducing the off-leakage current.

The operation control thin film transistor T5 includes the operation control semiconductor layer 131e, an operation control gate electrode 125e, an operation control source electrode 176e, and an operation control drain electrode 177e. The operation control source electrode 176e is a portion of the driving voltage line 172, and the operation control drain electrode 177e corresponds to the operation control drain region 177e doped with the impurity in the operation control semiconductor layer 131e.

The light emission control thin film transistor T6 includes the light emission control semiconductor layer 131f, a light emission control gate electrode 125f, a light emission control source electrode 176f, and a light emission control drain electrode 177f. The light emission control source electrode 176f corresponds to the light emission control source region 176f doped with the impurity in the light emission control semiconductor layer 131f, and the light emission control drain electrode 177f with the quadrangular shape is formed with the same layer and the same material as the data line 171.

One end of the driving semiconductor layer 131a of the driving thin film transistor T1 is connected to the switching semiconductor layer 131b and the operation control semiconductor layer 131e, and the other end of the driving semiconductor layer 131a is connected to the compensation semiconductor layer 131c and the light emission control semiconductor layer 131f. Accordingly, the driving source electrode 176a is connected to the switching drain electrode 177b and the operation control drain electrode 177e, and the driving drain electrode 177a is connected to the compensation source electrode 176c and the light emission control source electrode 176f.

The storage capacitor Cst includes a first storage capacitor plate 132 and the second storage capacitor plate 127 disposed via the first gate insulating layer 141 interposed therebetween. Here, the first gate insulating layer 141 is a dielectric material, and storage capacitance is determined by charges charged to the storage capacitor Cst and the voltage between both capacitor plates 132 and 127.

The first storage capacitor plate 132 is formed with the same layer as the driving semiconductor layer 131a, the switching semiconductor layer 131b, the compensation semiconductor layer 131c, the initialization semiconductor layer 131d, the operation control semiconductor layer 131e, the light emission control semiconductor layer 131f, and a first boosting capacitor plate 133, and is formed between the compensation semiconductor layer 131c and the initialization semiconductor layer 131d.

Also, the second storage capacitor plate 127 is formed with the same material and the same layer as the prior scan line 122, the light emission control line 123, the switching gate electrode 125b, and the second boosting capacitor plate 129. The second storage capacitor plate 127 may be formed of the gate wire including at least one metal of aluminum (Al), chromium (Cr), molybdenum (Mo), titanium (Ti), tantalum (Ta), an Al—Ni—La alloy, and an Al—Nd alloy.

The driving voltage line 172 passing and overlapping the storage capacitor Cst is connected to the second storage capacitor plate 127 through a contact hole 65 formed in the second gate insulating layer 142 and the interlayer insulating layer 160.

A connection member 174 is formed in substantially parallel to and with the same layer as the driving voltage line 172. The connection member 174 connects the driving gate electrode 125a and the first storage capacitor plate 132. One end 174a of the connection member 174 is connected to the driving gate electrode 125a through a contact hole 67 formed in the interlayer insulating layer 160, and the other end 174b of the connection member 174 is connected to the first storage capacitor plate 132 through a contact hole 64 continuously formed in the first gate insulating layer 141, the second gate insulating layer 142, and the interlayer insulating layer 160.

As described above, the first storage capacitor plate 132 of the storage capacitor Cst is connected to the driving gate electrode 125a through one end 174a of the connection member 174, and the second storage capacitor plate 127 of the storage capacitor Cst is connected to the driving voltage line 172 through the contact hole 65 formed in the second gate insulating layer 142 and the interlayer insulating layer 160, and thereby the storage capacitor Cst stores the storage capacitance corresponding to the difference between the driving voltage ELVDD transmitted through the driving voltage line 172 and the gate voltage of the driving gate electrode 125a.

Also, the first boosting capacitor plate 133 of the boosting capacitor Cb is an extension extended from the first storage capacitor plate 132, and the second boosting capacitor plate 129 is a protruding portion protruded from the scan line 121. The first boosting capacitor plate 133 has a hammer shape, and the first boosting capacitor plate 133 includes a grip portion substantially parallel to the driving voltage line 172 and a head portion formed at an end of the grip portion. The head portion of the first boosting capacitor plate 133 is positioned in the second boosting capacitor plate 129 while overlapping it.

Meanwhile, the switching thin film transistor T2 is used as a switch for selecting the pixel to be emitted. The switching gate electrode 125b is a portion of the scan line 121, the switching source electrode 176b is a portion of the data line 171, and the switching drain electrode 177b is connected to the driving thin film transistor T1 and the operation control thin film transistor T5. Also, the light emission control drain electrode 177f of the light emission control thin film transistor T6 is directly connected to the pixel electrode 191 of the organic light emitting diode 70 through a contact hole 181 formed in a protective layer 180.

Next, a structure of the OLED display according to the first embodiment will be described with reference to FIG. 4 to FIG. 6 according to a deposition sequence while focusing on the thin film transistor.

A buffer layer 111 is formed on a substrate 110, and the substrate 110 is formed of an insulating substrate made of glass, quartz, ceramics, plastics, or the like.

A driving semiconductor layer 131a, a switching semiconductor layer 131b, a compensation semiconductor layer 131c, an initialization semiconductor layer 131d, an operation control semiconductor layer 131e, and a light emission control semiconductor layer 131f are formed on the buffer layer 111. The driving semiconductor layer 131a includes a driving channel region 131a1, and a driving source region 176a and a driving drain region 177a facing each other via the driving channel region 131a1, and the switching semiconductor layer 131b includes a switching channel region 131b1, and a switching source region 132b and a switching drain region 177b facing each other via the switching channel region 131b1.

Also, the compensation semiconductor layer 131c includes a compensation channel region 131c1, and a compensation source region 176c and a compensation drain region 177c facing each other via the compensation channel region 131c1, and the initialization semiconductor layer 131d includes an initialization channel region 131d1, and an initialization source region 132d and an initialization drain region 177d facing each other via the initialization channel region 131d1.

Also, the operation control thin film transistor T5 includes an operation control channel region 131e1, and an operation control source region 176e and an operation control drain region 133e facing each other via the operation control channel region 131e1, and the light emission control thin film transistor T6 includes a light emission control channel region 131f1, and a light emission control source region 176f and a light emission control drain region 133f facing each other via the light emission control channel region 131f1.

The first gate insulating layer 141 formed of silicon nitride (SiN$_x$) or silicon oxide (SiO$_2$) is formed on the semiconductor layers 131a, 131b, 131c, 131d, 131e, and 131f.

A driving gate electrode 125a, a scan line 121 including a switching gate electrode 125b and the first compensation gate electrode 25c, a prior scan line 122 including the first initialization gate electrode 25d, a light emission control line 123 including an operation control gate electrode 125e and a light emission control gate electrode 125f, and the first gate wires 121, 122, 125a, 125b, 25c, 25d, 125e, 125f, 127, and 129 including the second storage capacitor plate 127 and the second boosting capacitor plate 129 are formed on the first gate insulating layer 141.

The second gate insulating layer 142 is formed on the first gate wires 121, 122, 125a, 125b, 25c, 25d, 125e, 125f, 127, and 129 and the first gate insulating layer 141. The second gate insulating layer 142 is formed of silicon nitride (SiN$_x$) or silicon oxide (SiO$_2$).

The second gate wires 26c and 26d including the second compensation gate electrode 26c and the second initialization gate electrode 26d are formed on the second gate insulating layer 142.

The second compensation gate electrode 26c is connected to the first compensation gate electrode 25c through a gate contact hole 81 formed in the second gate insulating layer 142. At this time, the first compensation gate electrode 25c is close to the compensation source electrode 176c of the compensation thin film transistor T3, and the second compensation gate electrode 26c is close to the compensation drain electrode 177c of the compensation thin film transistor T3.

Figure 6:
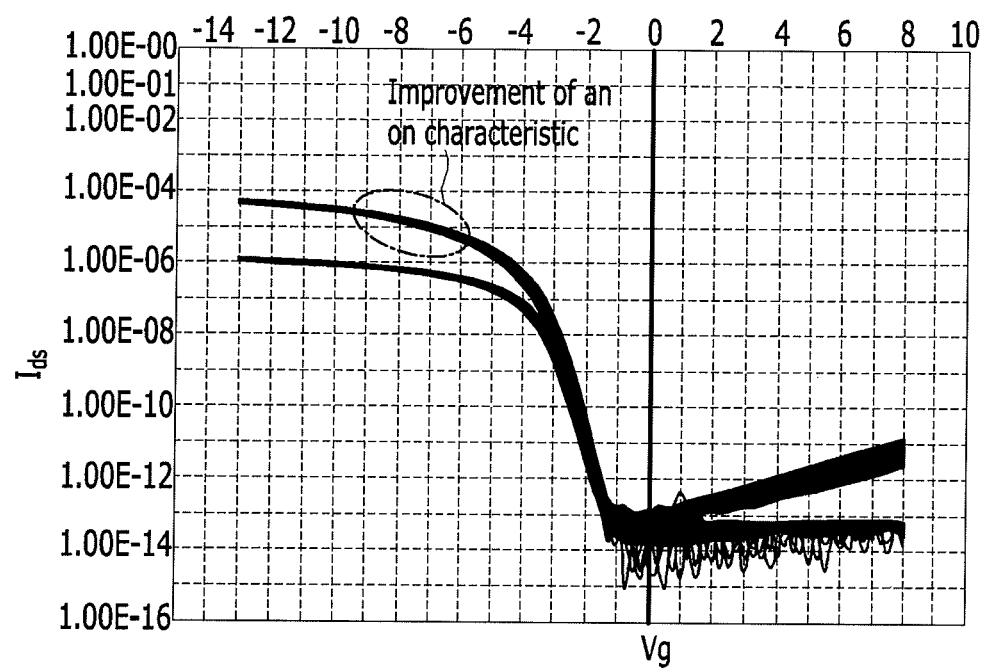
FIG. 6 is a graph showing a current (Ids) between a source and a drain according to a gate voltage (Vg) of the first compensation gate electrode in an OLED display according to the exemplary embodiment.
Figure 7:
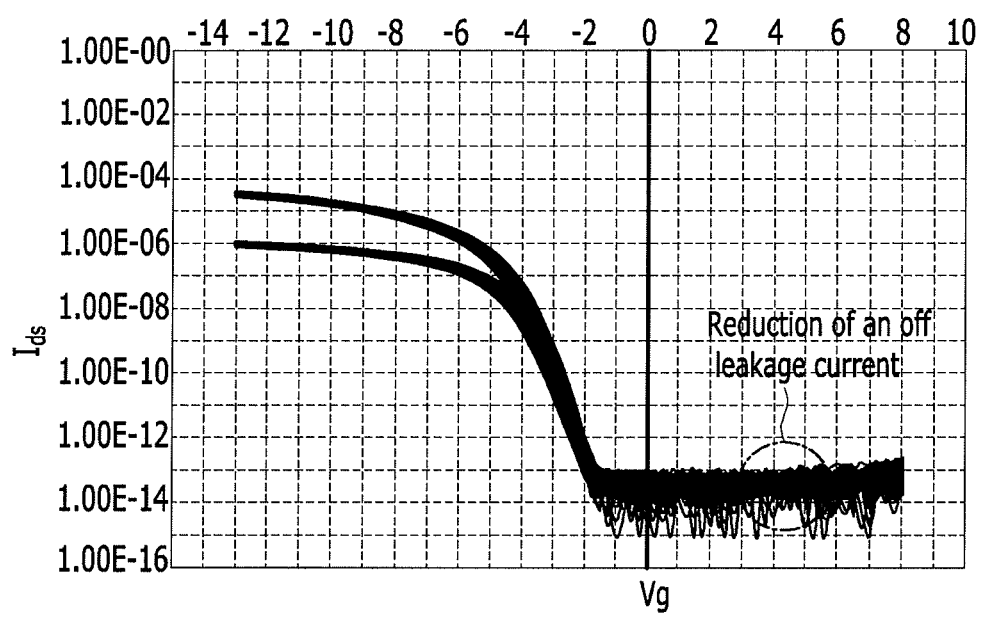
FIG. 7 is a graph showing a current (Ids) between a source and a drain according to a gate voltage (Vg) of the second compensation gate electrode in an OLED display according to the first embodiment.

FIG. 6 is a graph showing a current (Ids) between a source and a drain according to a gate voltage (Vg) of the first compensation gate electrode in an OLED display according to the first embodiment, and FIG. 7 is a graph showing a current (Ids) between a source and a drain according to a gate voltage (Vg) of the second compensation gate electrode in an OLED display according to the first embodiment.

As shown in FIG. 5 and FIG. 6, the first gate insulating layer 141 is only formed between the first compensation gate electrode 25c close to the compensation source electrode 176c in which the data signal Dm inflows and the compensation semiconductor layer 131c such that the interval between the first compensation gate electrode 25c and the compensation semiconductor layer 131c is small, and thereby the charge mobility is fast, and as a result, the on characteristics of the compensation thin film transistor T3 may be improved. Also, as shown in FIG. 5 and FIG. 7, the first gate insulating layer 141 and the second gate insulating layer 142 are formed between the second compensation gate electrode 26c close to the compensation drain electrode 177c connected to the driving gate electrode 125a of the driving thin film transistor T10 and the compensation semiconductor layer 131c such that the interval between the second compensation gate electrode 26c and the compensation semiconductor layer 131c is far, thereby reducing the off-leakage current. As described above, the off-leakage current is decreased such that the gate voltage of the driving gate electrode 125a of the driving thin film transistor T1 is uniformly maintained, thereby preventing generation of spots.

Accordingly, the charge mobility is improved in the on state and simultaneously the off-leakage current is decreased, thereby improving the on and off characteristics.

Also, since the first compensation gate electrode 25c and the second compensation gate electrode 26c forming the dual gate electrode are formed with the different layers, an interval d1 between the first compensation gate electrode 25c and the second compensation gate electrode 26c may be reduced such that the dual gate electrode structure may be applied for high resolution of more than 400 ppi (pixel per inch).

Meanwhile, like the compensation gate electrode 125c, the second initialization gate electrode 26d is connected to the first initialization gate electrode 25d through a gate contact hole 82 formed in the second gate insulating layer 142.

At this time, the first initialization gate electrode 25d is close to the initialization source electrode 176d of the initialization thin film transistor T4, and the second initialization gate electrode 26d is close to the initialization drain electrode 177d of the initialization thin film transistor. The first gate insulating layer 141 is only formed between the first initialization gate electrode 25d close to the initialization source electrode 176d in which the initialization voltage Vint inflows and the initialization semiconductor layer 131d such that the interval between the first initialization gate electrode 25d and the initialization semiconductor layer 131d is narrow, and thereby the charge mobility is fast, and accordingly the one characteristic of the initialization thin film transistor T4 may be improved. Also, the first gate insulating layer 141 and the second gate insulating layer 142 are formed between the second initialization gate electrode 26d close to the initialization drain electrode 177d connected to the driving gate electrode 125a of the driving thin film transistor T1 and the initialization semiconductor layer 131d such that the interval between the second initialization gate electrode 26d and the initialization semiconductor layer 131d is wide, thereby reducing the off-leakage current. As described above, the off-leakage current is decreased such that the gate voltage of the driving gate electrode 125a of the driving thin film transistor T1 is uniformly maintained, thereby preventing generation of spots.

Accordingly, the charge mobility is improved in the on state and simultaneously the off-leakage current is decreased, thereby improving the on and off characteristics.

Also, since the first initialization gate electrode 25d and the second initialization gate electrode 26d forming the dual gate electrode structure are formed with the different layers, the interval d2 between the first initialization gate electrode 25d and the second initialization gate electrode 26d formed in substantially parallel to each other may be reduced such that the dual gate electrode structure may be applied in the high resolution of more than 400 ppi (pixel per inch).

An interlayer insulating layer 160 is formed on the second gate wires 26c and 26d and the second gate insulating layer 142. The interlayer insulating layer 160 is formed of a ceramic-based material such as silicon nitride ($SiN_x$) or silicon oxide ($SiO_2$) like the first gate insulating layer 141 and the second gate insulating layer 142.

A data wire including a data line 171 having a switching source electrode 176b, a driving voltage line 172 including a driving control source electrode 176e, a connection member 174 substantially parallel to the driving voltage line 172, an initialization source electrode 176d, and a light emission control drain electrode 177f is formed on the interlayer insulating layer 160.

Also, the switching source electrode 176b is connected to the switching source region 132b of the switching semiconductor layer 131b through a contact hole 69 formed in the first gate insulating layer 141, the second gate insulating layer 142, and the interlayer insulating layer 160, and the initialization source electrode 176d is connected to the initialization source region 132d of the initialization semiconductor layer 131d through the contact hole 62 formed in the first gate insulating layer 141, the second gate insulating layer 142, and the interlayer insulating layer 160.

The driving control source electrode 176e is connected to a driving control source region 132e of the driving control semiconductor layer 131e through a contact hole 71 formed in the first gate insulating layer 141, the second gate insulating layer 142, and the interlayer insulating layer 160, and the light emission control drain electrode 177f is connected to a light emission control drain region 133f of the light emission control semiconductor layer 131f through a contact hole 72 formed in the first gate insulating layer 141, the second gate insulating layer 142, and the interlayer insulating layer 160.

A protective layer 180 covering the data wires 171, 172, 174, 176b, 176e, 176d, and 177f is formed on the interlayer insulating layer 160, and a pixel electrode 190 and an initialization voltage line 124 are formed on the protective layer 180. The pixel electrode 190 is connected to the light emission control drain electrode 177f through the contact hole 181 formed in the protective layer 180, and the initialization voltage line 124 is connected to the initialization source electrode 176d through a contact hole 182 formed in the protective layer 180.

A barrier rib 210 is formed on the edge of the pixel electrode 190 and the protective layer 180, and the barrier rib 210 has a barrier rib opening 211 exposing the pixel electrode 190. The barrier rib 210 can be made of an inorganic material of a resin or silica group such as a polyacrylate resin and a polyimide.

An organic emission layer 220 is formed on the pixel electrode 190 exposed through the barrier rib opening 211, and a common electrode 230 is formed on the organic emission layer 220. As described above, an OLED 200 including the pixel electrode 190, the organic emission layer 220, and the common electrode 230 is formed.

Here, the pixel electrode 190 is an anode as a hole injection electrode and the common electrode 230 is a cathode as an electron injection electrode. However, the pixel electrode 190 may be the cathode and the common electrode 230 may be the anode according to the driving method of the organic light emitting diode display. Holes and electrons are injected from the pixel electrode 190 and the common electrode 230 into the organic emission layer 220, and when the exciton that is combined with the injected holes and electrons falls from an exited state to a ground state, light is emitted.

The organic emission layer 220 is formed of a low molecular weight organic material or a high molecular weight organic material such as PEDOT (poly 3,4-ethylene dioxythiophene). Further, the organic emission layer 220 may be formed as a multilayer including one or more of an emission layer, a hole injection layer HIL, a hole transport layer HTL, an electron transport layer ETL, and an electron injection layer EIL. In the case where all the layers are included, the hole injection layer HIL is disposed on the pixel electrode 190 that is the anode, and the hole transport layer HTL, the emission layer, the electron transport layer ETL, and the electron injection layer EIL are sequentially laminated thereon. Since the common electrode 230 is formed of a reflective conductive material, a rear surface light emission type of organic light emitting diode display is obtained. A material such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material.

Meanwhile, in the first embodiment, the compensation thin film transistor and the initialization thin film transistor only have the dual gate electrode structure, however the second embodiment including at least one of the switching thin film transistor, the driving control thin film transistor, and the light emission control thin film transistor has the dual gate electrode structure is possible.

Next, an OLED display according to the second embodiment will be described with reference to FIG. 8.

Figure 8:
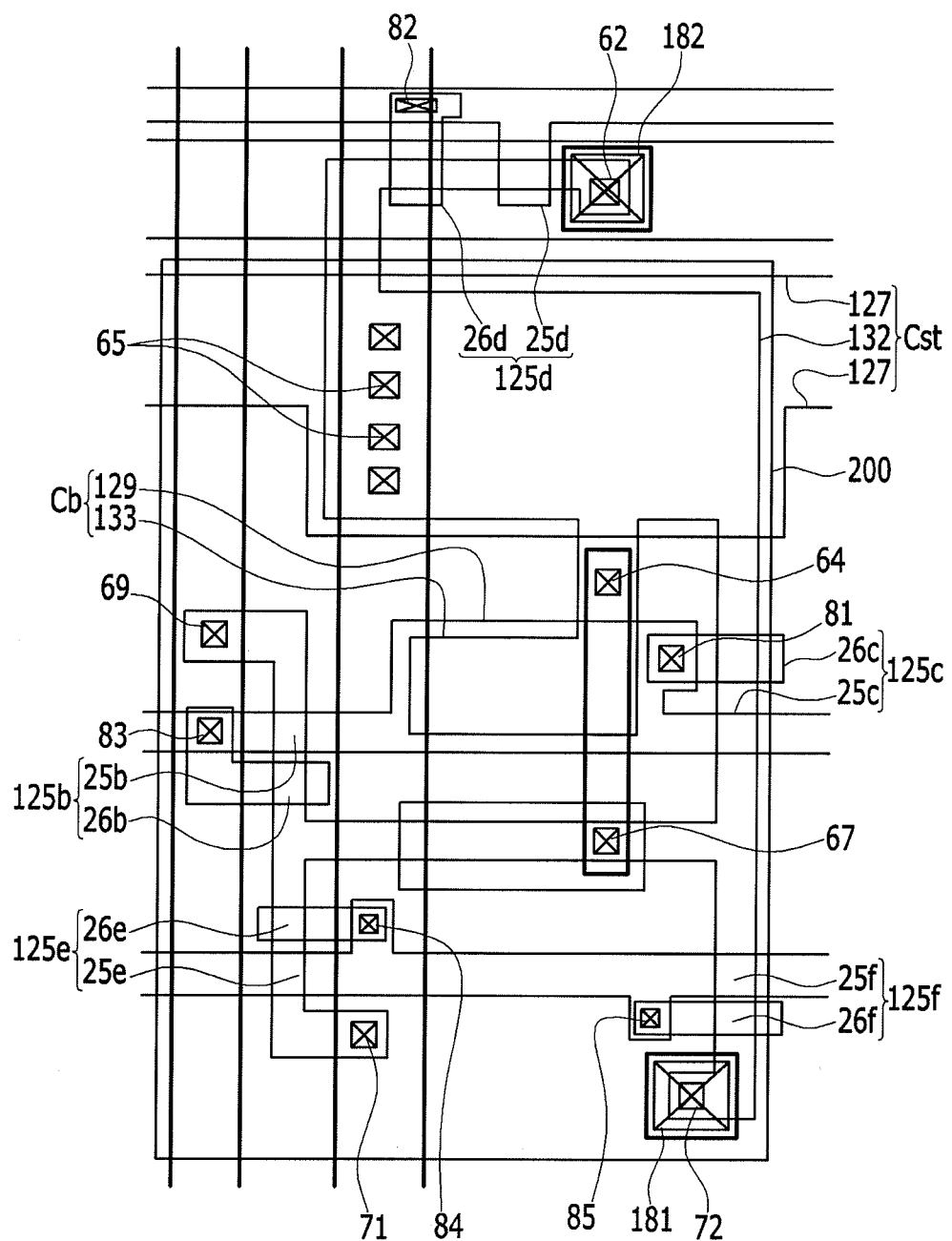
FIG. 8 is a layout view of one pixel of an OLED display according to a second embodiment.

FIG. 8 is a layout view of one pixel of an OLED display according to a second embodiment.

The second embodiment is substantially equivalent to the first embodiment shown in FIG. 1 to FIG. 5 except for a switching thin film transistor, a driving control thin film transistor, and a light emission control thin film transistor of the dual gate electrode structure.

As shown in FIG. 8, in the OLED display according to the second embodiment, a switching gate electrode 125b of the switching thin film transistor T2 includes a first switching gate electrode 25b as a portion of the scan line 121 and a second switching gate electrode 26b separated and formed with a different layer from the first switching gate electrode 25b, the driving control gate electrode of the driving control thin film transistor includes a first driving control gate electrode 25e as a portion of the light emission control line 123 and a second driving control gate electrode 26e separated and formed with the different layer from the first driving control gate electrode 25e, and the light emission control gate electrode of the light emission control thin film transistor includes a first light emission control gate electrode 25f as a portion of the light emission control line 123 and a second light emission control gate electrode 26f separated and formed with the different layer from the first light emission control gate electrode 25f.

The detailed structure of the switching gate electrode, the driving control gate electrode, and the light emission control gate electrode will described later.

As shown in FIG. 8, the first gate insulating layer 141 covering the switching semiconductor layer, the driving control semiconductor layer, and the light emission control semiconductor layer is formed, the first switching gate electrode 25b, the first driving control gate electrode 25e, and the first light emission control gate electrode 25f are formed on the first gate insulating layer 141, and the second gate insulating layer 142 covering the first gate insulating layer 141, the first switching gate electrode 25b, the first driving control gate electrode 25e, and the first light emission control gate electrode 25f is formed. The second switching gate electrode 26b, the second driving control gate electrode 26e, and the second light emission control gate electrode 26f are formed on the second gate insulating layer 142, and the second switching gate electrode 26b, the second driving control gate electrode 26e, and the second light emission control gate electrode 26f are respectively connected to the first switching gate electrode 25b, the first driving control gate electrode 25e, and the first light emission control gate electrode 25f through gate contact holes 82, 83, and 84 formed in the second gate insulating layer 142. At this time, the first switching gate electrode 25b is close to the switching source electrode 176b of the switching thin film transistor T2, and the second switching gate electrode 26b is close to the switching drain electrode 177b of the switching thin film transistor T2. Also, the first driving control gate electrode 25e is close to the driving control source electrode 176e of the driving control thin film transistor T5, and the second driving control gate electrode 26e is close to the driving control drain electrode 177e of the driving control thin film transistor T5. Also, the first light emission control gate electrode 25f is close to the light emission control source electrode 176f of the light emission control thin film transistor T6, and the second light emission control gate electrode 26f is close to the light emission control drain electrode 177f of the light emission control thin film transistor T6.

The first gate insulating layer 141 is only formed between the first switching gate electrode 25b close to the switching source electrode 176b and the switching semiconductor layer 131b such that the interval between the first switching gate electrode 25b and the switching semiconductor layer 131b is small such that the charge mobility is fast, and accordingly, the one characteristic of the switching thin film transistor T2 may be improved. Also, the first gate insulating layer 141 and the second gate insulating layer 142 are formed between the second switching gate electrode 26b close to the switching drain electrode 177b and the switching semiconductor layer 131b such that the interval between the second switching gate electrode 26b and the switching semiconductor layer 131b is larger such that the off-leakage current may be reduced.

The operation control gate electrode 125e and the light emission control gate electrode 125f also improve the charge mobility in the on state of the driving control thin film transistor T5 and the light emission control thin film transistor T6 like the switching gate electrode 125b, and simultaneously reduce the off-leakage current thereby improving the on and off characteristics.

Meanwhile, in the first embodiment, the first compensation gate electrode 25c and the second compensation gate electrode 26c form the dual gate electrode structure, however the third embodiment in which the first compensation gate electrode 25c and the second compensation gate electrode 26c are formed with an angle therebetween is possible.

Next, an OLED display according to the third embodiment will be described with reference to FIG. 9.

Figure 9:
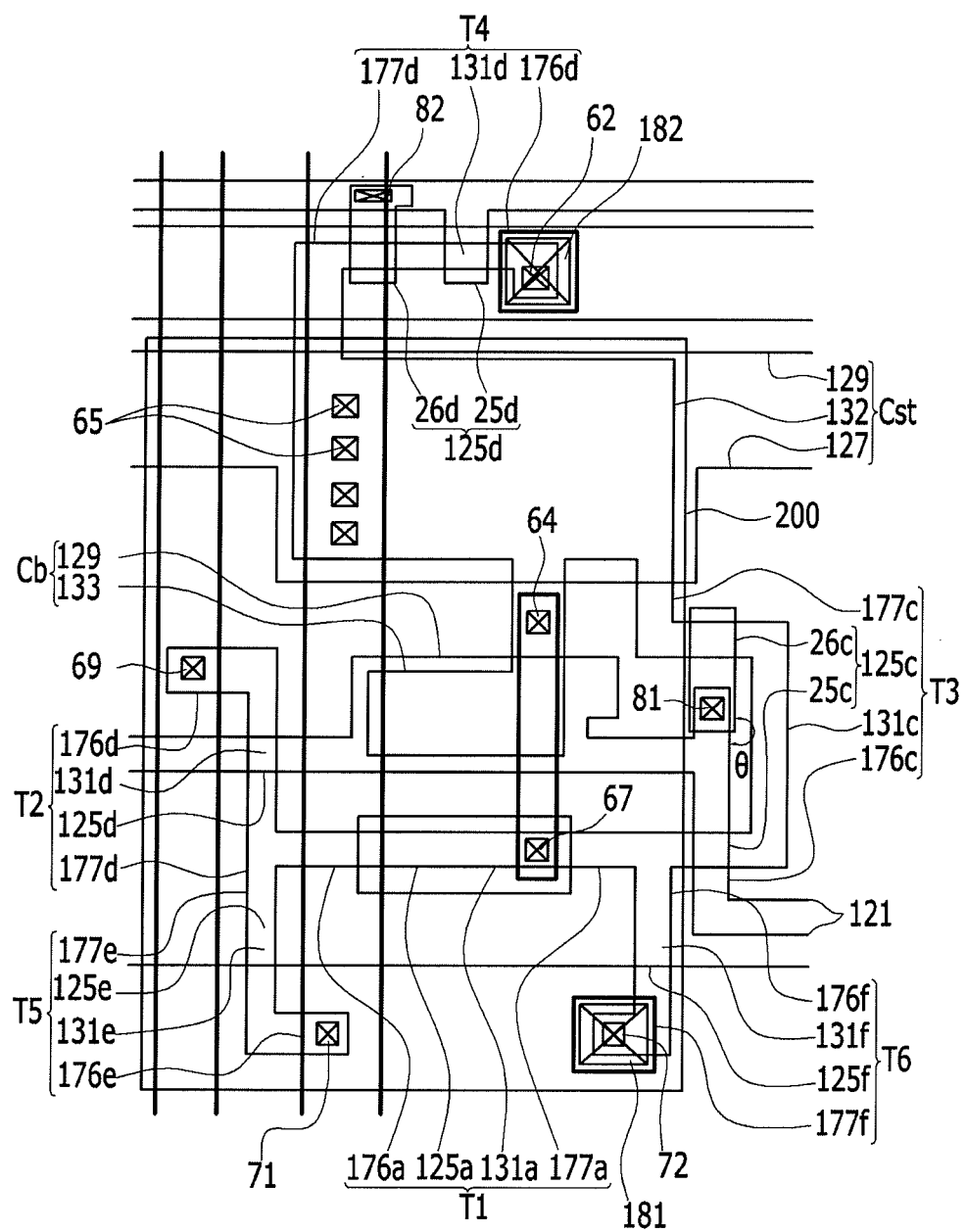
FIG. 9 is a layout view of one pixel of an OLED display according to a third embodiment.

FIG. 9 is a layout view of one pixel of an OLED display according to a third embodiment.

The third embodiment is substantially equivalent to the first embodiment shown in FIG. 1 to FIG. 5 regarding an angle between the first compensation gate electrode and the second compensation gate electrode.

As shown in FIG. 9, in the OLED display according to the third embodiment, the compensation gate electrode 125c includes the first compensation gate electrode 25c as a portion of the scan line 121 and the second compensation gate electrode 26c separated from the first compensation gate electrode 25c with a predetermined angle and formed with a different layer.

The first compensation gate electrode 25c and the second compensation gate electrode 26c shown in FIG. 3 are formed with an angle of 180 degrees, but it is not limited thereto. To form the angle of 180 degrees between the first compensation gate electrode 25c and the second compensation gate electrode 26c, the first compensation gate electrode 25c is curved in the scan line 121 and the compensation semiconductor layer 131c is also curved.

As described above, the compensation gate electrode 125c is formed with the dual gate electrode structure including the first compensation gate electrode 25c and the second compensation gate electrode 26c thereby reducing the off-leakage current.

According to at least one of the disclosed embodiments, the compensation gate electrode of the compensation thin film transistor is formed with a dual gate electrode structure including first and second compensation gate electrodes, and the first compensation gate electrode is adjacent to the compensation source electrode in which the data signal inflows such that charge mobility may be improved, while the second compensation gate electrode is adjacent to the compensation drain electrode such that the off-leakage current may be reduced.

As described above, the charge mobility is improved and simultaneously the off-leakage current is reduced, thereby improving the on and off characteristics, and the off-leakage current is reduced such that the gate voltage of the driving gate electrode of the driving thin film transistor is uniquely maintained thereby preventing spots.

Also, the first and second compensation gate electrodes forming the dual gate electrode structure are formed over the different layers such that the interval between the first and second compensation gate electrodes may be reduced, thereby applying the dual gate electrode structure at a high resolution of more than, for example, about 400 ppi (pixel per inch).

Also, the initialization gate electrode of the initialization thin film transistor, the switching gate electrode of the switching thin film transistor, the operation control gate electrode of the operation control thin film transistor, and the light emission control gate electrode of the light emission control thin film transistor are also formed with the same structure as the compensation gate electrode of the dual gate electrode structure such that the charge mobility is improved and simultaneously the off-leakage current is reduced, thereby improving the on and off characteristics.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a substrate;
   a scan line formed on the substrate and configured to transmit a scan signal;
   a data line and a driving voltage line crossing the scan line and respectively configured to transmit a data signal and a driving voltage;
   a switching thin film transistor operatively connected to the scan line and the data line;
   a driving thin film transistor operatively connected to the switching thin film transistor and the driving voltage line;
   a compensation thin film transistor configured to compensate a threshold voltage of the driving thin film transistor and operatively connected to the driving thin film transistor; and
   an OLED operatively connected to the driving thin film transistor,
   wherein the compensation thin film transistor comprises a first compensation gate electrode and a second compensation gate electrode separated from each other and formed over different layers, and wherein the first and second compensation gate electrodes do not overlap each other in the depth dimension of the OLED display,
   wherein the compensation thin film transistor further comprises:
   a compensation semiconductor layer formed on the substrate;
   a first gate insulating layer covering the compensation semiconductor layer, wherein the first compensation gate electrode is formed over the first gate insulating layer; and
   a second gate insulating layer covering the first gate insulating layer and the first compensation gate electrode, wherein the second compensation gate electrode is formed over the second gate insulating layer, and
   wherein the compensation semiconductor layer, the first gate insulating layer, the first compensation gate electrode, the second gate insulating layer, and the second compensation gate electrode are sequentially disposed on the substrate in perpendicular direction to the substrate.

2. The OLED display of claim 1, wherein the compensation thin film transistor further comprises a compensation source electrode and a compensation drain electrode, wherein the first compensation gate electrode is adjacent to the compensation source electrode, and
   wherein the second compensation gate electrode is adjacent to the compensation drain electrode.

3. The OLED display of claim 1, wherein the first compensation gate electrode is electrically connected to the second compensation gate electrode through a gate contact hole formed in the second gate insulating layer.

4. The OLED display of claim 2, wherein the first and second compensation gate electrodes are substantially parallel to each other.

5. The OLED display of claim 2, wherein the first and second compensation gate electrodes are formed with an angle therebetween.

6. The OLED display of claim 3, wherein the first compensation gate electrode and the scan line are formed on the same layer.

7. The OLED display of claim 1, further comprising:
   an initialization thin film transistor configured to be turned on according to a previous scan signal transmitted through a previous scan line and configured to transmit an initialization voltage to the driving gate electrode of the driving thin film transistor, and
   wherein the initialization thin film transistor comprises a first initialization gate electrode and a second initialization gate electrode that are separated from each other and formed over different layers.

8. The OLED display of claim 7, wherein the initialization thin film transistor further comprises:
   an initialization semiconductor layer formed on the substrate, and
   wherein the first initialization gate electrode is formed on a first gate insulating layer covering the initialization semiconductor layer,
   and the second initialization gate electrode is formed on a second gate insulating layer covering the first gate insulating layer and the first initialization gate electrode.

9. The OLED display of claim 8, wherein the initialization thin film transistor further comprises an initialization source electrode and an initialization drain electrode, wherein the first initialization gate electrode is adjacent to the initialization source electrode, and
   wherein the second initialization gate electrode is adjacent to the initialization drain electrode.

10. The OLED display of claim 8, wherein the first initialization gate electrode is electrically connected to the second initialization gate electrode through a gate contact hole formed in the second gate insulating layer.

11. The OLED display of claim 8, wherein the first and second initialization gate electrodes are substantially parallel to each other.

12. The OLED display of claim 8, wherein the first and second initialization gate electrodes are formed with an angle therebetween.

13. The OLED display of claim 7, wherein the first initialization gate electrode and the scan line are formed on the same layer.

14. The OLED display of claim 7, wherein the switching thin film transistor includes a first switching gate electrode and a second switching gate electrode separated from each other and formed over different layers.

15. The OLED display of claim 14, wherein the switching thin film transistor further comprises:
    a switching semiconductor layer formed on the substrate;
    a first gate insulating layer covering the switching semiconductor layer, wherein the first switching gate electrode is formed over the first gate insulating layer; and
    a second gate insulating layer covering the first gate insulating layer and the first switching gate electrode, wherein the second switching gate electrode is formed over the second gate insulating layer.

16. The OLED display of claim 15, wherein the switching thin film transistor further comprises a switching source electrode and a switching drain electrode, wherein the first switching gate electrode is adjacent to the switching source electrode, and
    wherein the second switching gate electrode is adjacent to the switching drain electrode.

17. The OLED display of claim 15, wherein the first switching gate electrode is electrically connected to the second switching gate electrode through a gate contact hole formed in the second gate insulating layer.

18. The OLED display of claim 7, further comprising:
    a light emission control thin film transistor configured to be turned on by a light emission control signal transmitted through the light emission control line and configured to transmit the driving voltage from the driving thin film transistor to the OLED, and wherein the light emission control thin film transistor comprises a first light emission control gate electrode and a second light emission control gate electrode that are separated from each other and formed over different layers.

19. The OLED display of claim 18, wherein the light emission control thin film transistor further comprises:
a light emission control semiconductor layer formed on the substrate, and
wherein the first light emission control gate electrode is formed on a first gate insulating layer covering the light emission control semiconductor layer,
and the second light emission control gate electrode is formed on a second gate insulating layer covering the first gate insulating layer and the first light emission control gate electrode.

20. The OLED display of claim 19, wherein the light emission control thin film transistor further comprises a light emission control source electrode and a light emission control drain electrode, wherein the first light emission control gate electrode is adjacent to the light emission control source electrode, and
wherein the second light emission control gate electrode is adjacent to the light emission control drain electrode.

21. The OLED display of claim 19, wherein the first light emission control gate electrode is electrically connected to the second light emission control gate electrode through a gate contact hole formed in the second gate insulating layer.

22. The OLED display of claim 18, further comprising:
an operation control thin film transistor configured to be turned on by a light emission control signal transmitted through the light emission control line and configured to transmit the driving voltage to the driving thin film transistor, and
wherein the operation control thin film transistor comprises a first operation control gate electrode and a second operation control gate electrode that are separated from each other and formed over different layers.

23. The OLED display of claim 22, wherein the operation control thin film transistor further comprises:
an operation control semiconductor layer formed on the substrate, and
wherein the first operation control gate electrode is formed on a first gate insulating layer covering the operation control semiconductor layer,
and the second operation control gate electrode is formed on a second gate insulating layer covering the first gate insulating layer and the first operation control gate electrode.

24. The OLED display of claim 23, wherein the operation control thin film transistor further comprises an operation control source electrode and an operation control drain electrode, wherein the first operation control gate electrode is adjacent to the operation control source electrode, and
wherein the second operation control gate electrode is adjacent to the operation control drain electrode.

25. The OLED display of claim 23, wherein the first operation control gate electrode is electrically connected to the second operation control gate electrode through a gate contact hole formed in the second gate insulating layer.

26. The OLED display of claim 1, wherein the second compensation gate electrode is farther from the substrate than the first compensation gate electrode, and wherein the second compensation gate electrode is wider than the first compensation gate electrode.

* * * * *